(12) United States Patent
Cho et al.

(10) Patent No.: US 6,724,204 B2
(45) Date of Patent: Apr. 20, 2004

(54) PROBE STRUCTURE FOR TESTING SEMICONDUCTOR DEVICES AND METHOD FOR FABRICATING THE SAME

(75) Inventors: Dong-il Cho, Seoul (KR); Sangjun Park, Seoul (KR)

(73) Assignee: IC Mems, Inc., Seoul (KR)

( * ) Notice: Subject to any disclaimer, the term of this patent is extended or adjusted under 35 U.S.C. 154(b) by 0 days.

(21) Appl. No.: 10/125,248

(22) Filed: Apr. 18, 2002

(65) Prior Publication Data

US 2002/0153911 A1 Oct. 24, 2002

(30) Foreign Application Priority Data

Apr. 18, 2001 (KR) ......................... 2001-20840

(51) Int. Cl.[7] ............................................. G01R 31/02
(52) U.S. Cl. ...................................... 324/754; 324/762
(58) Field of Search ............................... 324/754–755, 324/757–758, 762; 29/447–448, 825, 846; 438/700–706, 712, 739, 748, 753

(56) References Cited

U.S. PATENT DOCUMENTS

| | | | |
|---|---|---|---|
| 3,867,698 A | * 2/1975 | Beltz et al. | ................. 324/762 |
| 4,563,640 A | 1/1986 | Hasegawa | |
| 5,070,297 A | 12/1991 | Kwon et al. | |
| 5,172,050 A | 12/1992 | Swapp | |
| 5,475,318 A | 12/1995 | Marcus et al. | |
| 5,848,465 A | * 12/1998 | Hino et al. | ................. 324/757 |
| 5,917,330 A | * 6/1999 | Miley | ......................... 324/762 |
| 5,994,750 A | * 11/1999 | Yagi | ............................. 257/415 |
| 6,072,321 A | 6/2000 | Akram et al. | |
| 6,150,275 A | 11/2000 | Choe et al. | |
| 6,204,674 B1 | * 3/2001 | Dabrowiecki et al. | ...... 324/754 |
| 6,469,532 B2 | * 10/2002 | Akram et al. | ............... 324/754 |

FOREIGN PATENT DOCUMENTS

KR 1999-79113 4/1998

* cited by examiner

*Primary Examiner*—Kamand Cuneo
*Assistant Examiner*—Jermele Hollington
(74) *Attorney, Agent, or Firm*—Head, Johnson & Kachigian (57) ABSTRACT

Disclosed are a probe structure for testing semiconductor devices and a method for fabricating the probe structure. The fabricated probe structure of the present invention satisfies the high density, the uniformity of size, height and spacing, and the integration of elements. The probe structure of the present invention solves the conventional problems such as long fabrication time of the probe structure, difficulty in finely controlling the structure of the probe structure, complexity of the whole process, mechanical instability of the products, and difficulty in uniformly assembling a plurality of the probe structures. Additionally, the probe structure of the present invention solves several problems caused in an actual testing step of the semiconductor devices, for instance, long testing time of the semiconductor device, difficulty in providing the sufficient contact force between the probe structure and the semiconductor device, and having to specially design the test pads of the semiconductor device.

7 Claims, 10 Drawing Sheets

PROBE STRUCTURE FOR TESTING SEMICONDUCTOR DEVICES AND METHOD FOR FABRICATING THE SAME

BACKGROUND OF THE INVENTION

1. Field of the Invention

The present invention relates to a probe structure for testing semiconductor devices. More particularly, the present invention relates to a probe structure for testing semiconductor devices, which is fabricated by a series of semiconductor fabrication process which can be finely controlled. Therefore, the probe structure for testing semiconductor devices according to the present invention satisfies the high density of the probe structures, the uniformity of size, height and spacing of the probe structures, and the integration of the probe structures, thereby maximizing efficiency of the test process of the semiconductor devices. Further, the present invention relates to a method for fabricating the probe structure for testing semiconductor devices.

2. Description of the Related Art

As well known to those skilled in the art, prior to a packaging process, semiconductor devices on a wafer are tested. In this testing step, a probe structure including a plurality of needles is mounted on a testing equipment. Then, the semiconductor devices are inspected using the testing equipment, thereby detecting defective products generated by mistakes of the fabrication process of the semiconductor devices.

Herein, the probe structure, which comes in contact the semiconductor device, serves to transmit test signals from the external testing equipment to the semiconductor device, or to transmit output signals from the semiconductor device to the external testing equipment.

Since the probe structures intermediate between the external testing device and semiconductor device, the characteristic of the probe structure is very important parameter that may affect the reliability of test process for semiconductor devices. Therefore, researches on probe structure have been extensively performed.

For example, U.S. Pat. No. 4,563,640 entitled "Fixed probe board", U.S. Pat. No. 5,070,297 entitled "Full wafer integrated circuit testing device", U.S. Pat. No. 5,172,050 entitled "Micromachined semiconductor probe card", U.S. Pat. No. 6,072,321 entitled "Micromachined silicon probe card for semiconductor device and method of fabrication", and U.S. Pat. No. 5,475,318 entitled "Microprobe" disclose representative conventional probe structures.

However, these conventional probe structures still have many problems, as follows.

For instance, a probe card as disclosed in the aforementioned U.S. Pat. No. 4,563,640 is manufactured by assembling a plurality of metal needles by hand, thereby causing several problems such as long assembly time and high assembly cost. Further, it is difficult to regulate the exact position and the height of the needles. Therefore, a worker should frequently re-adjust the position or the height of the needles.

That is, since it is difficult to integrate a plurality of needles on the probe card, the probe card tests only a small fraction of the integrated circuit chips on a semiconductor wafer, thereby increasing time for testing a full wafer including the chips.

Therefore, in order to simultaneously test tens of semiconductor wafers manufactured a day, plural test equipments are required.

The aforementioned U.S. Pat. No. 5,070,297 discloses a testing device comprising probe tips made of metal, which are mounted on a flexible polyimide base. Compared with U.S. Pat. No. 4,563,640, the integration can be easily obtained.

However, it is difficult to control the residual stress of the polyimide layer and the mechanical characteristics of the metal probe tips. Therefore, because of these drawbacks, the testing device of this patent cannot be easily used in the testing step of the wafer including the integrated circuit chips.

Further, the aforementioned U.S. Pat. No. 5,172,050 discloses a probe card formed by bulk micromachining a single crystalline silicon. The probe card comprises micromachined probe beams and probe tips rested on the probe beams. In this patent, it is not easy to bulk-micromachine the probe beams with conventional techniques. Further, since there is a separate process of resting the probe tips on the probe beams, the whole process is complicated and it is difficult to maintain the mechanical stability of the probe tips. Another problem is that test pads of the semiconductor device must be newly designed corresponding to the shapes of the probe beams and probe tips of the probe card.

The aforementioned U.S. Pat. No. 6,072,321 discloses a membrane probe card including silicon/metal thin film probe tips formed thereon. Compared with the earlier patents, the mechanical stability of the probe tips of this patent can be easily obtained. However, since the membrane probe card of this patent does not comprise means for providing sufficient contact forces between the probe tips and the test pads of the semiconductor device, a fluid for applying a pressure to the membrane might be required. This might cause the worker inconvenience.

Finally, the aforementioned U.S. Pat. No. 5,475,318 discloses a microprobe with a bimorph structure of a double layer comprising aluminum and silicon layer, and an integrated heating element made of polysilicon. The microprobe is actuated by the heat supplied from the heating element, thereby coming in contact with the semiconductor device. In this case, it is difficult to integrally fabricate the probe beam, the probe tip and the heating element. Further, since the microprobe is formed by depositing a thin film, the microprobe is affected by residual stress and stress gradient of the membrane. Therefore, it is difficult to maintain the mechanical stability of the microprobe. Moreover, in addition to signal lines for providing interface with the semiconductor devices, a signal line for driving the heating element is required, thereby complicating peripheral circuits.

In view of the foregoing problems associated with conventional probe structures for testing semiconductor devices, there is a need for a probe structure with improved functions.

SUMMARY OF THE INVENTION

Therefore, the present invention has been made in view of the above problems, and it is an object of the present invention to finely control a fabricating process of a probe structure, thereby solving the problem of long fabrication time and the difficulty in finely controlling the structure of the probe structure.

It is a further object of the present invention to perform the fabricating process of the probe structure on a single bulk substrate, thereby achieving uniform size, height, and spacing of the probe structures assembled in one unit.

It is another object of the present invention to increase the density of the probe structure, thereby simultaneously testing a full wafer or a very large fraction of the integrated circuit devices on a semiconductor wafer, and solving the problems such as lengthened testing time and having to newly design the test pads of the semiconductor device according to the shapes of probe beams and probe tips of the probe structure.

It is still another object of the present invention to integrate the probe structure, thereby solving the difficulty in performing the contact between the probe structure and the semiconductor device due to non-uniformity of size, height and spacing of the probe structures.

It is yet another object of the present invention to unify the whole structure of the probe structure, thereby simplifying the process and stabilizing the mechanical characteristics of the probe structure.

In accordance with the present invention, the above and other objects can be accomplished by the provision of a probe structure for testing semiconductor devices. The probe structure comprises a base substrate, a protrusion formed integrally with the base substrate, probe beams branching off from the protrusion, and probe tips rested on the ends of the probe beams.

Herein, the protrusion is protruded from the upper surface of the base substrate at a designated angle, and extends along the upper surface of the base substrate. The probe beams are positioned above the upper surface of the base substrate, and extend along the upper surface of the base substrate in a different direction, preferably perpendicular direction, to the extension of the protrusion. The probe tips are protruded from the upper surface of the base substrate, and mechanically and electrically come in contact with the test pads of the semiconductor device.

The probe structure of the present invention is manufactured via the semiconductor fabrication process which can be finely controlled, and the fabricated probe structure satisfies the high density, the uniformity of size, height and spacing, and the integration of elements, thereby solving the conventional problems such as unnecessary increase in fabrication time of the probe structure, difficulty in finely controlling the structure of the probe structure, complexity of the whole process, mechanical instability of the products, and difficulty in uniformly assembling a plurality of the probe structures. Additionally, the probe structure of the present invention solves several problems caused in an actual testing step of the semiconductor devices, for instance, small-scale of testing process for semiconductor device, lengthening of testing time of the semiconductor device, difficulty in providing the sufficient contact force between the probe structure and the semiconductor device, and having to newly design the test pads of the semiconductor device according to the shapes of the probe beams and probe tips of the probe card.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
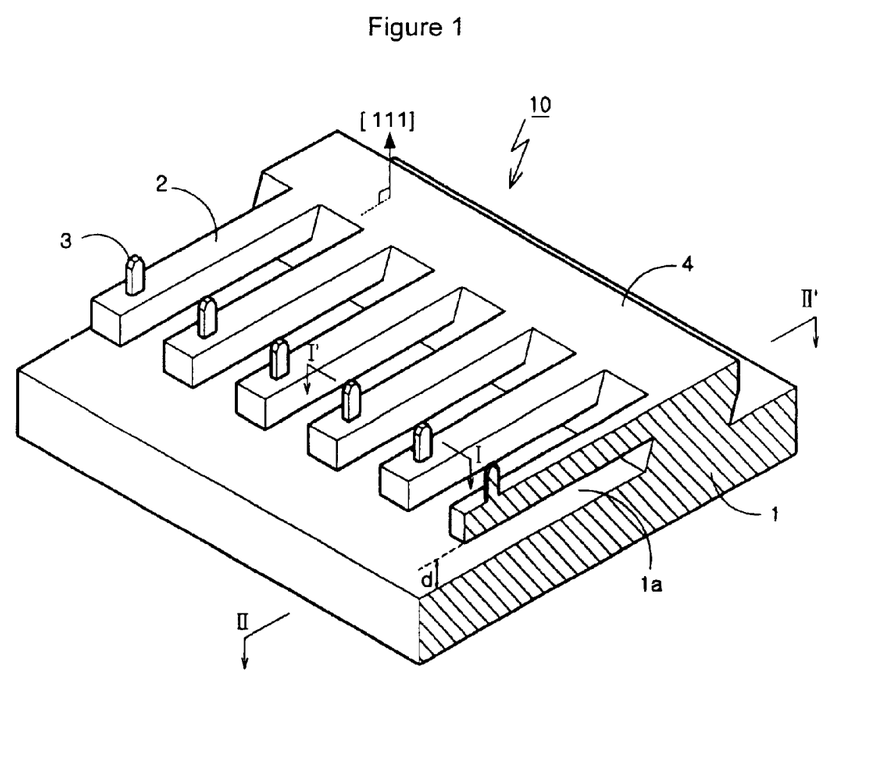
FIG. 1 is a perspective view of a probe structure for testing semiconductor devices according to the present invention.

FIG. 1 is a perspective view of a probe structure for testing semiconductor devices according to the present invention.

As shown in FIG. 1, a probe structure 10 for testing semiconductor devices according to the present invention comprises a base substrate 1, a protrusion 4, probe beams 2, and probe tips 3.

The protrusion 4, which is formed integrally with the base substrate 1, is protruded from the upper surface 1a of the base substrate 1 at a designated angle and horizontally extends along the upper surface 1a of the base substrate 1, for instance, in a lengthwise direction of surface 1a.

As shown in FIG. 1, the probe beams 2 are integrated with the protrusion 4 and branch off from the one end of the protrusion 4. The probe beams 2 horizontally extend along the breadthwise direction of surface 1a of the base substrate 1.

As described above, since the protrusion 4 is protruded from the upper surface 1a of the base substrate 1 with a designated slope, the probe beams 2 branching off from the protrusion 4 are separated from the upper surface 1a of the base substrate 1 by a predetermined distance (d). That is, the probe beams 2 are positioned above the upper surface 1a of the base substrate 1.

The probe tips 3 are formed on ends of the corresponding probe beams 2 and protruded from the probe beams 2 in a direction perpendicular to the upper surface 1a of the base substrate 1.

As shown in FIG. 1, the base substrate 1, the protrusion 4, the probe beams 2, and the probe tips 3 are integrally formed in one unit, i.e., the probe structure 10.

The base substrate 1, the protrusion 4, the probe beams 2, and the probe tips 3 are successively fabricated by a patterning process using a single bulk substrate as a mother substrate, thereby integrally forming the base substrate 1, the protrusion 4, the probe beams 2, and the probe tips 3 in one unit.

Therefore, each elements of the probe structure 10 of the present invention, i.e., the base substrate 1, the protrusion 4, the probe beams 2, and the probe tips 3 are all made of the same material as that of the bulk substrate.

If single crystalline silicon is used as the bulk substrate, the base substrate 1, the protrusion 4, the probe beams 2, and the probe tips 3 are also made of single crystalline silicon.

Alternatively, even if SOI (Silicon On Insulator) or SOG (Silicon On Glass) is used as the bulk substrate, the base substrate 1, the protrusion 4, the probe beams 2, and the probe tips 3 are also made of single crystalline silicon.

Herein, the bulk substrate is made of one selected from the group of consisting of (111) single crystalline silicon, (111) SOI, and (111) SOG of which crystal face is (111).

It is very important that (111) single crystalline silicon, (111) SOI, or (111) SOG is used as the bulk substrate of the present invention. In the etching step for forming the base substrate 1, the protrusion 4, and probe beams 2, the etch is selectively performed with respect to different crystallographic planes, thereby not etching and leaving the {111} plane. Thus, the thickness of the base substrate 1, the protrusion 4, and the probe beams 2 can be finely controlled.

Korean Patent Publication No. 1999-79113 (Korean Patent Application No. 98-11519) entitled "Micromachining fabrication method using (111) single crystalline silicon" and U.S. Pat. No. 6,150,275 entitled "Micromechanical system fabrication method using (111) single crystalline silicon" disclose this technology.

Figure 2:
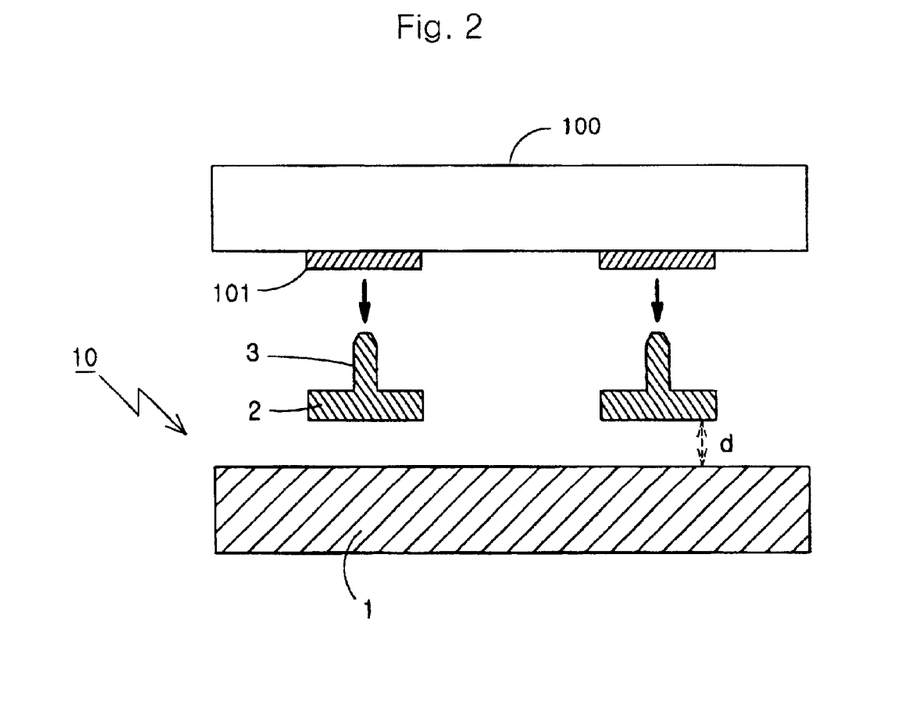
FIG. 2 is a cross-sectional view taken along line I—I of FIG. 1.

As shown in FIG. 2, the probe structure 10 for testing semiconductor devices is electrically connected to a semiconductor device 100, thereby testing the semiconductor device 100.

The probe tip 3 protruded from the probe beam 2 is in mechanical and electrical contact with corresponding one of test pads 101 of the semiconductor device 100. Of course, as described above, the probe beam 2 supporting the probe tip 3 mounted thereon is positioned above the base substrate 1 by a designated distance (d).

The probe structure 10 of the present invention serves to transmit test signals from an external testing equipment (not shown) to the semiconductor device 100 or to transmit output signals from the semiconductor device 100 to the external testing equipment, thereby effectively accomplishing the testing process of semiconductor devices.

Hereinafter, a method for fabricating the probe structure 10 for testing semiconductor devices of the present invention is described in detail.

The method for fabricating the probe structure 10 for testing semiconductor devices of the present invention is divided into two steps. The first is a step of patterning a designated area of one surface of the bulk substrate at a designated depth, thereby forming the probe tips 3. The second is a step of patterning both sides of the surface of the bulk substrate, thereby integrally forming the base substrate 1, a plurality of the probe beams 2 positioned above the base substrate 1, and the protrusion 4 integrated with the probe beams 2.

First of all, the step of forming the probe tips 3 is described.

Figure 3A:
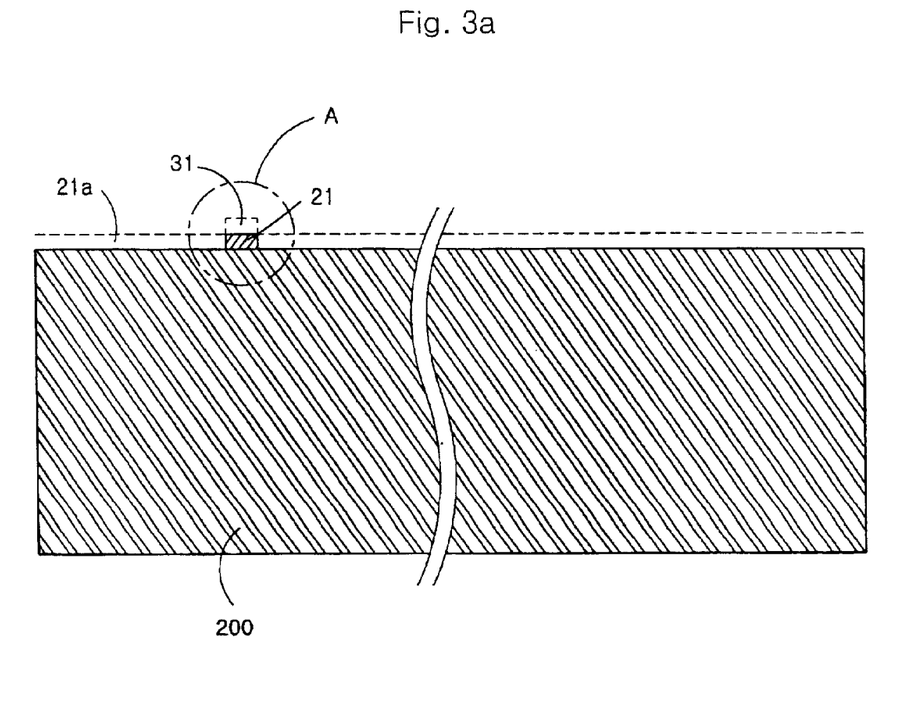
FIGS. 3a to 3j are cross-sectional views illustrating a method for fabricating the probe structure for testing semiconductor devices according to the present invention.

As shown in FIG. 3a, an insulation layer with a designated thickness, e.g., an silicon oxide layer, is deposited on the upper surface of the bulk substrate 200 made of single crystalline silicon by a chemical vapor deposition (CVD) or a thermal oxidation process. Of course, the bulk substrate 200 may be made of SOI and SOG as well as single crystalline silicon. Herein, as described above, single crystalline silicon, SOI and SOG are oriented in the direction of the (111) plane.

Then, the upper surface of the insulation layer 21a is coated with photoresist (not shown). The photoresist serves as an etching mask. The photoresist is selectively removed until the insulation layer 21a is exposed so that the photoresist remains only on probe tip portions. Thereby, a photoresist pattern 31 is left only on the probe tip portions of the insulation layer 21a.

The exposed portions of the insulation layer 21a are etched using the photoresist pattern 31 as the etching mask until the bulk substrate 200 is exposed, thereby forming an insulation pattern 21. Then, the photoresist pattern 31 is fully removed from the insulation pattern 21.

Figure 3B:
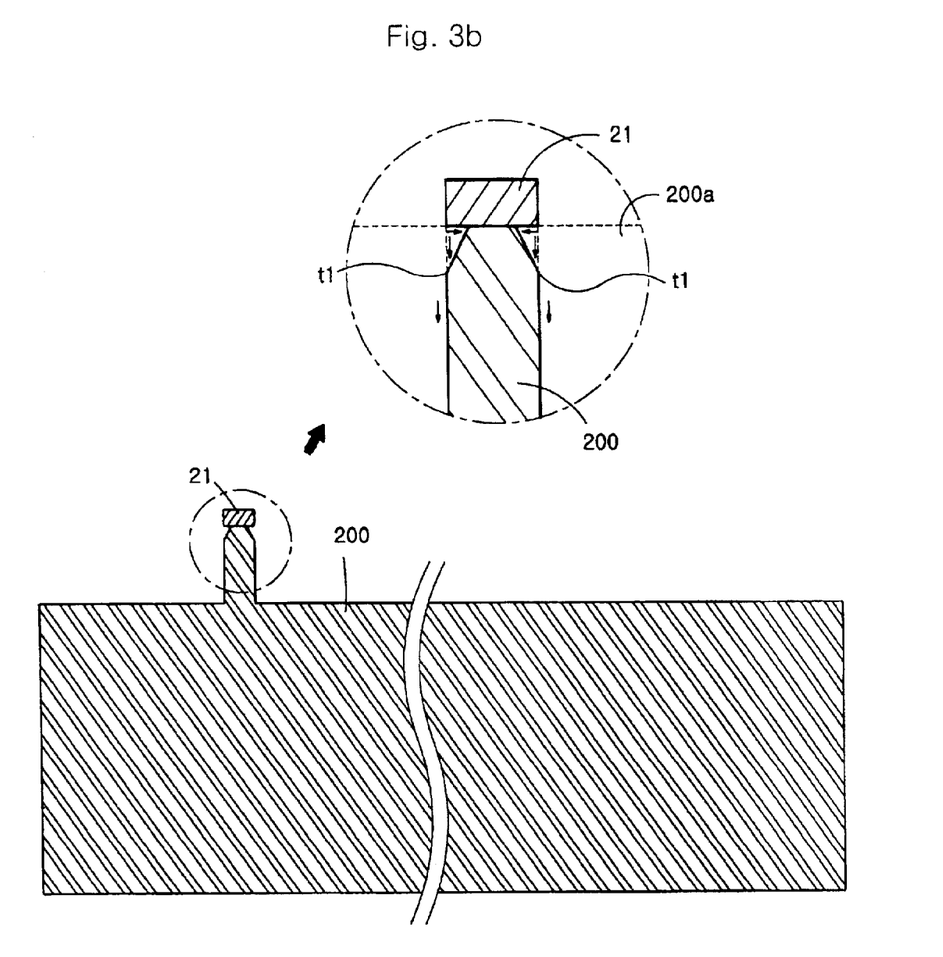

As shown in FIG. 3b, the exposed portions 200a of the bulk substrate 200 are isotropically etched to a designated depth by a deep silicon etching method using the insulation pattern 21 as an etching mask.

The isotropic etching is performed up to the depth of t1. As shown in FIG. 3b, since the bulk substrate 200 is etched in both directions, i.e., a horizontal and a vertical directions, the portions of the bulk substrate 200 under the insulation pattern 21 are defined as a narrow tip of the probe tip 3.

Under the depth of t1, the exposed portions 200a of the bulk substrate 200 are anisotropically etched to a designated depth also using the insulation pattern 21 as the etching mask. At this time, since the bulk substrate 200 is etched in only one direction, i.e., a vertical direction, the portions of the bulk substrate 200 under the narrow tip forms a body of the probe tip 3.

Figure 3C:
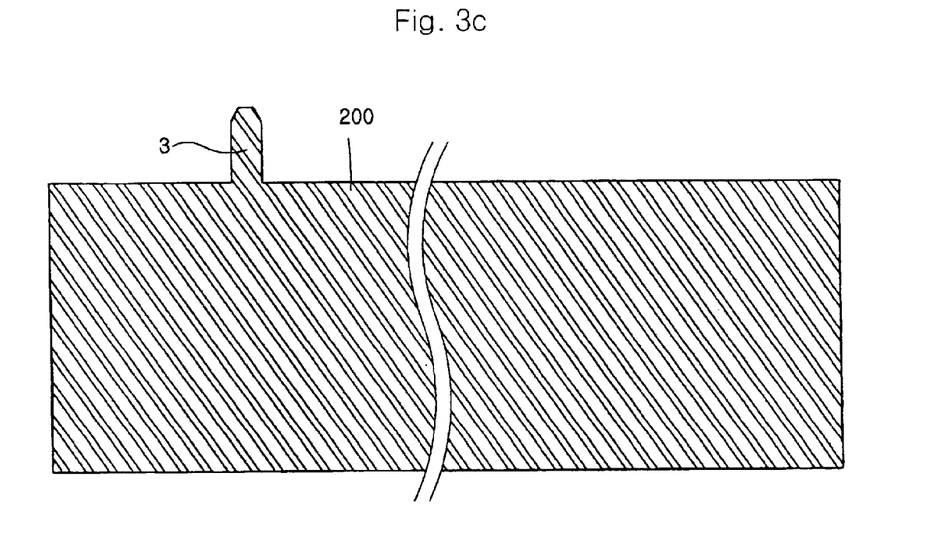

After the aforementioned isotropic and anisotropic etching, the insulation pattern 21 is removed. Then, as shown in FIG. 3c, the probe tip 3 in the shape of pillar with narrow tip is formed.

Next, the step of integrally forming the base substrate 1, a plurality of the probe beams 2 positioned above the base substrate 1, and the protrusion 4 integrated with the probe beams 2 is described.

Figure 3D:
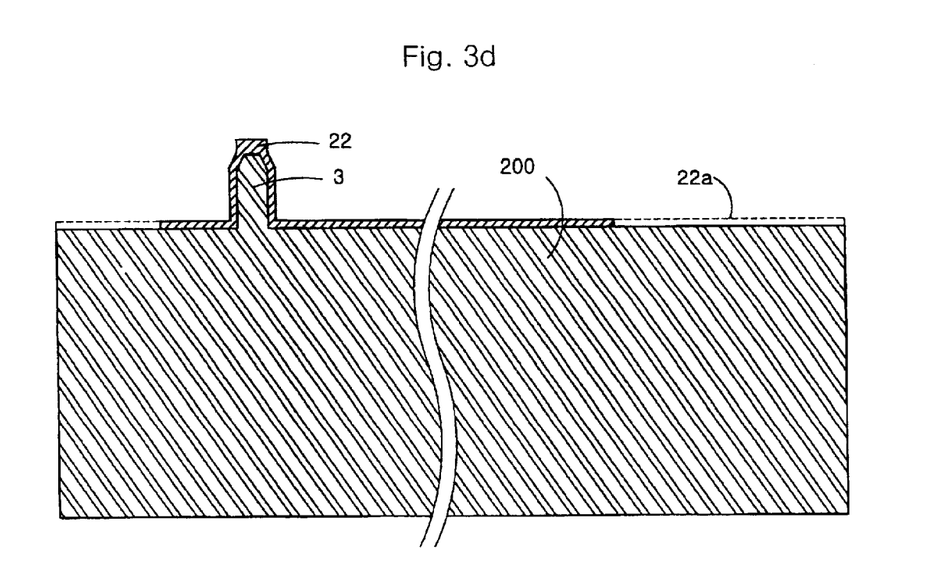

As shown in FIG. 3d, an insulation layer 22a with a designated thickness is formed on the upper surface of the bulk substrate 200 including the probe tip 3 by a chemical vapor deposition (CVD) or a thermal oxidation process. For example, a silicon oxide layer may be used as the insulation layer 22a.

The upper layer of the insulation layer 22a is coated with a photoresist (not shown) to be used as an etching mask. The photoresist on the whole area except for a probe beam area is selectively removed, thereby exposing the insulation layer 22a. Therefore, the photoresist is left only on the probe beam area, for example, a predetermined inner portion except for both edge portions of the bulk substrate 200.

The exposed insulation layer 22a is etched using the photoresist pattern as the etching mask until the bulk substrate 200 is exposed, thereby forming an insulation layer pattern 22. Then, the photoresist on the insulation layer pattern 22 is fully removed.

Figure 3E:
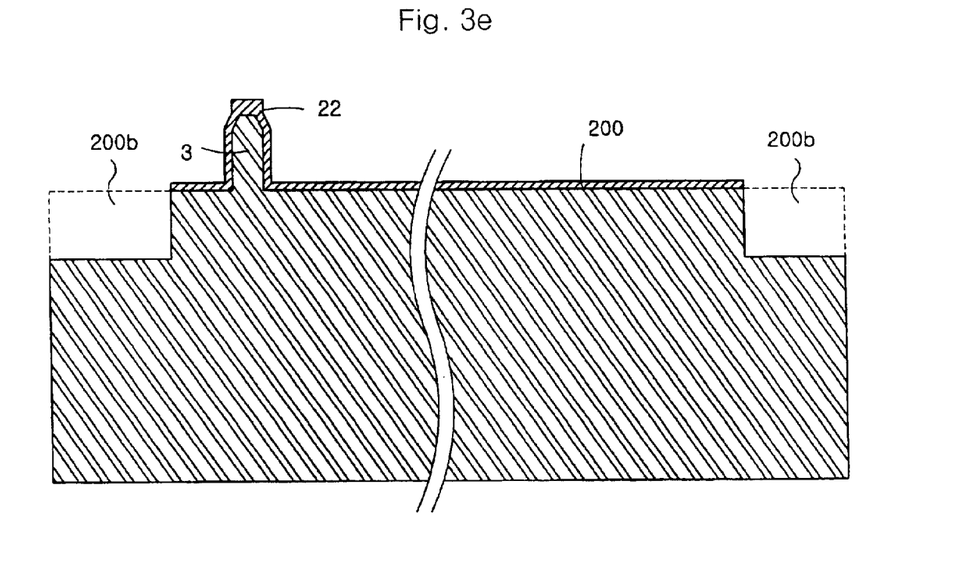

As shown in FIG. 3e, the exposed portion 200b of the bulk substrate 200 is anisotropically etched using the insulation layer pattern 22 as the etching mask by a deep silicon etching method. Herein, the exposed portion 200b of the bulk substrate 200 is etched to a designated depth, for example, to a depth the same as the thickness of the produced probe beam 2.

Figure 3F:
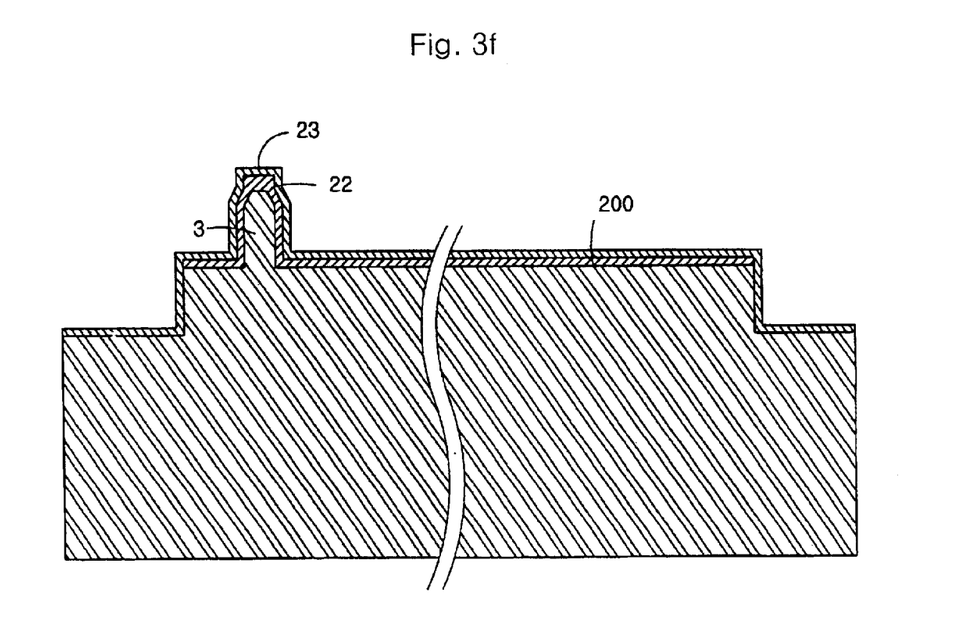

Then, as shown in FIG. 3f, a passivation layer 23 with a designated thickness, i.e., a silicon oxide layer or a silicon nitride layer, is formed on the upper surface of the bulk substrate 200 including the insulation layer pattern 22 by a chemical vapor deposition (CVD). The passivation layer 23 may be a thermal oxide layer formed by the thermal oxidation process. The passivation layer 23 serves to prevent the edges of the bulk substrate 200 from being etched during a step for forming a trench, which will be described later.

Figure 3G:
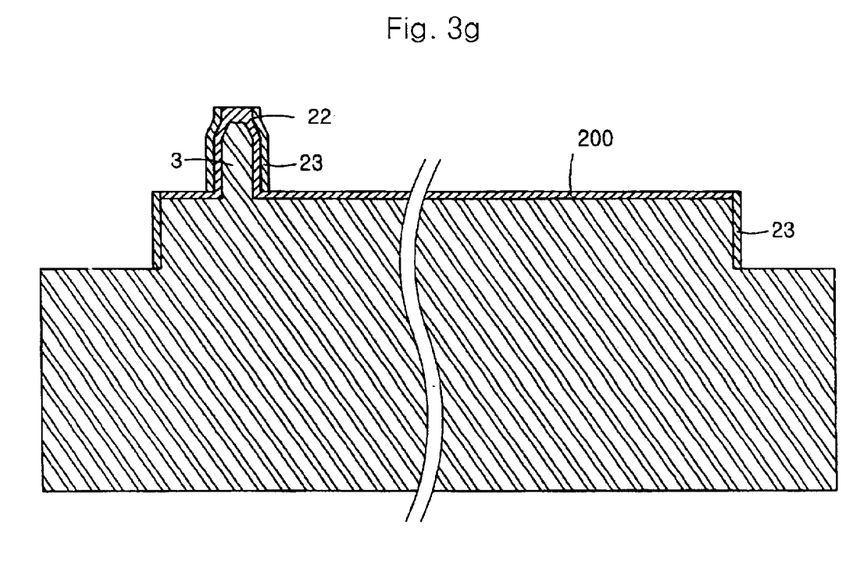

As shown in FIG. 3g, portions of the passivation layer 23 on the insulation pattern 22 and the bulk substrate 200 are removed by the anisotropic etching, thereby leaving the passivation layer 23 only on the sidewalls of the bulk substrate 200 and exposing the insulation pattern 22 and the bulk substrate 200.

Figure 3H:
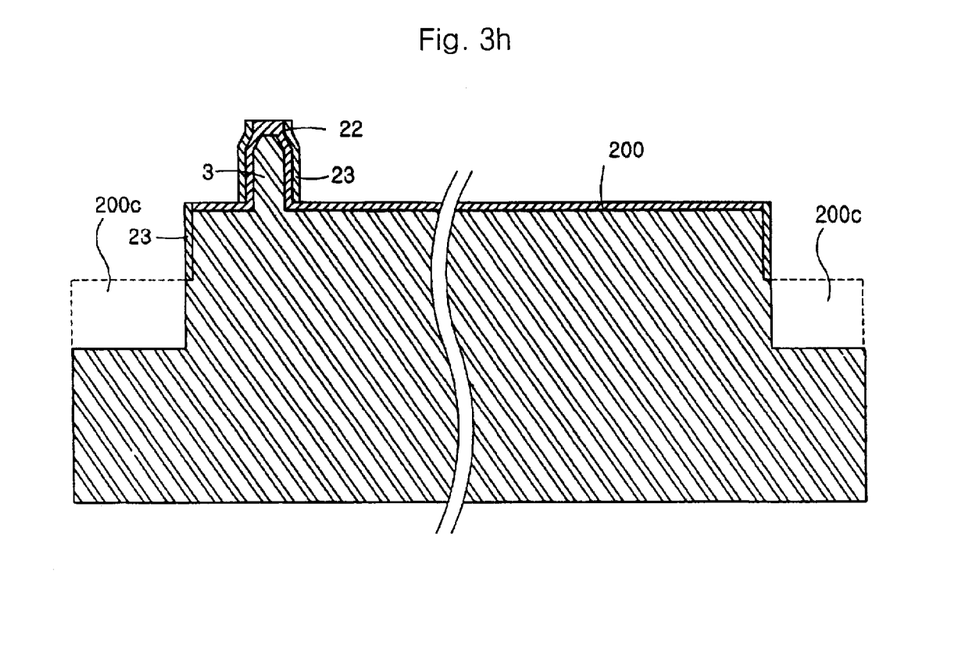

Then, as shown in FIG. 3h, the exposed portion 200c of the bulk substrate 200 is anisotropically etched by using the insulation layer pattern 22 as the etching mask by a deep silicon etching method. Herein, the exposed portion 200c of the bulk substrate 200 is etched to a designated depth, for example, by a depth the same as the separated distance (d) of the probe beam 2 from the base substrate 1.

Then, the bulk substrate 200 is dipped into a wet etch solution. Herein, the wet etch solution is a solution with a different etch rate according to the crystalline direction of the bulk substrate 200, and preferably is an alkaline solution such as KOH solution, TMAH (tetramethylammonium hydroxide) solution, NaOH solution, or EDP (ethylene diamine pyrocatechol) solution.

Figure 3I:
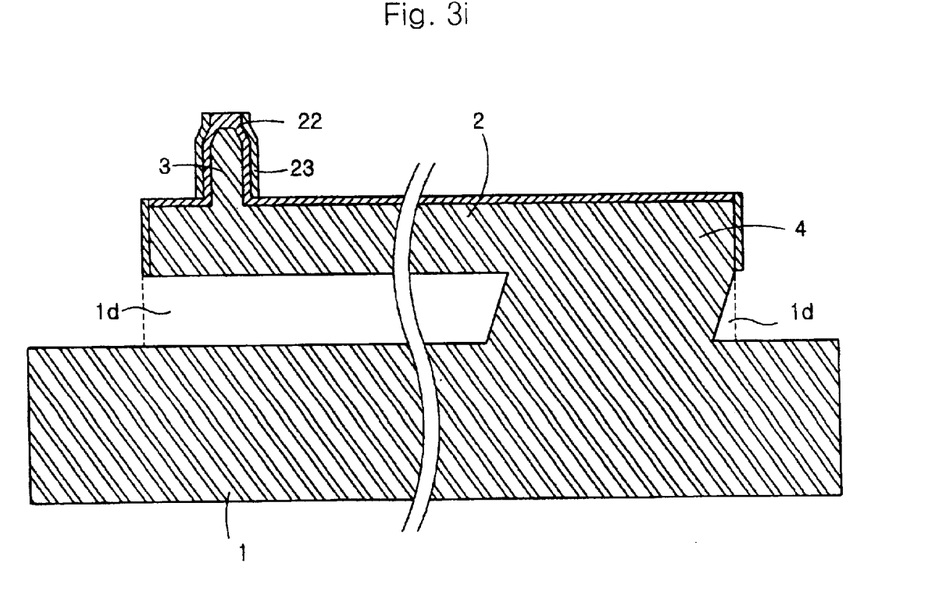

As described above, the bulk substrate 200 is oriented in a direction of the (111) plane. Therefore, when the bulk substrate 200 is dipped into the wet etching solution, the {100} planes and the {110} planes of the bulk substrate 200 are etched but the {111} plane of the bulk substrate 200 is not etched. Thus, as shown in FIG. 3i, a trench 1d, which is deeply dug into the bulk substrate 200, is formed on the bulk substrate 200 below the probe tip 3. By forming the trench 1d, the base substrate 1, the probe beam 2 positioned above the base substrate 1, and the protrusion 4 integrated with the probe beam 2 are collectively defined on each area of the bulk substrate 200.

Herein, the left {111} planes after the etching process are a little tilted against the [111] direction. Therefore, the produced protrusion 4 is a little sloped.

As described above, according to the present invention, elements, i.e., the base substrate 1, the protrusion 4, the probe beams 2, and the probe tips 3 are successively produced from a single bulk substrate 200. That is, all the elements of the present invention are integrally produced from the bulk substrate 200. Therefore, the probe structure 10 of the present invention has excellent mechanical characteristics without the residual stress and the stress gradient of the thin film.

Further, the probe structure 10 of the present invention is not the conventional membrane structure but is a micromachined structure of the conventional needle structure. Therefore, the probe structure 10 of the present invention can provide the sufficient contact forces to the test pads 101 of the semiconductor device 100 without an additional pressure device.

Further, since the probe tips 3 and the probe beams 2 are finely formed by the semiconductor fabrication process, in order to test the semiconductor devices 100, the worker need not frequently re-adjust the position or the height of the probe tips, nor specially design the test pads 101 of the semiconductor device 100. The probe tips 3 and the probe beams 2 can be easily highly integrated, thereby simultaneously testing a very large fraction of the semiconductor devices on a wafer.

Moreover, the probe beams 2 of the present invention are positioned above the base substrate 100 by a designated distance, thereby more easily testing semiconductor devices with various thickness variations.

Figure 3J:
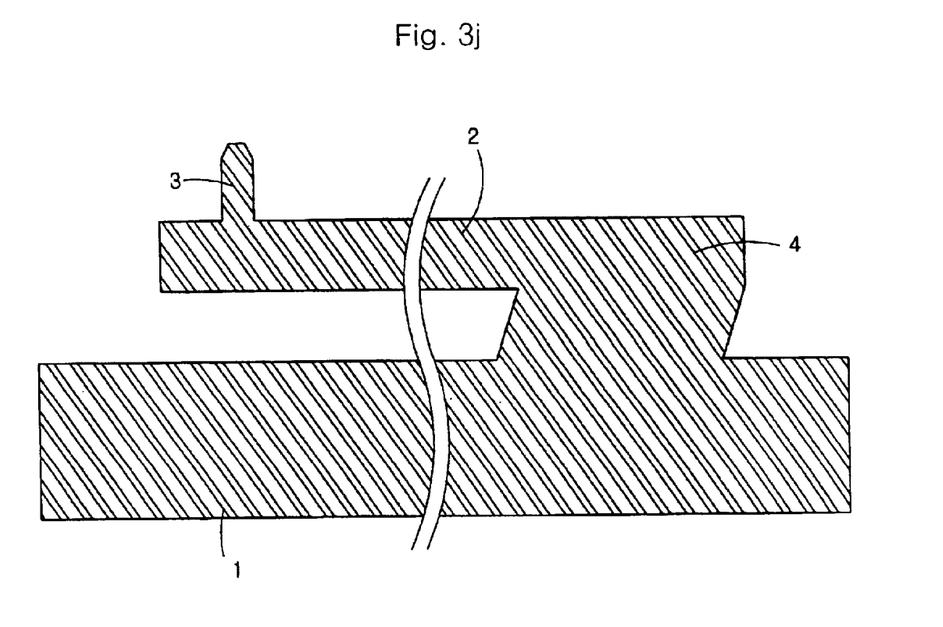
Figure 4:
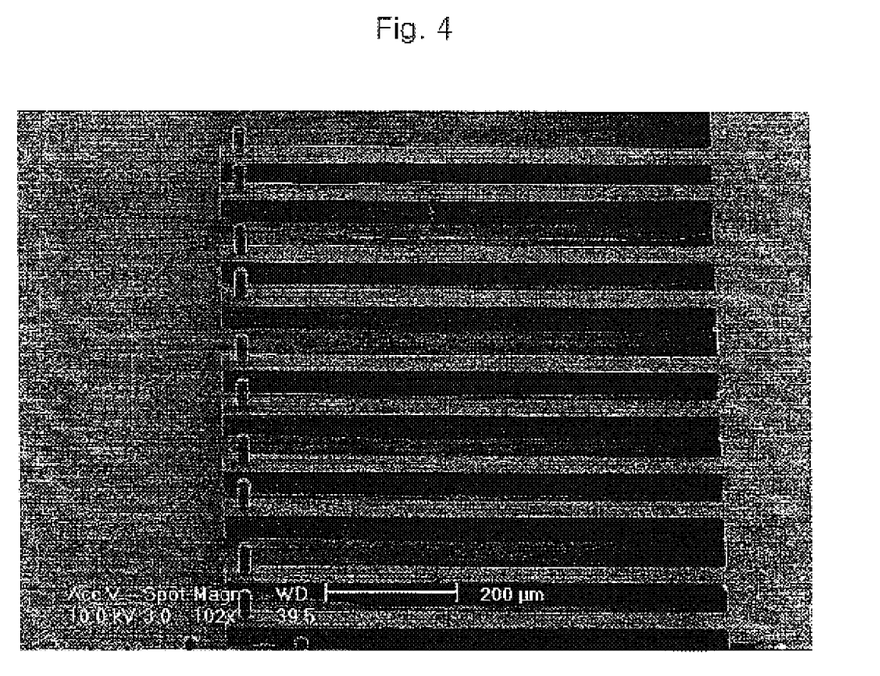
FIGS. 4 and 5 are enlarged scanning electron micrographs of the probe structure for testing semiconductor devices according to the present invention.
Figure 5:
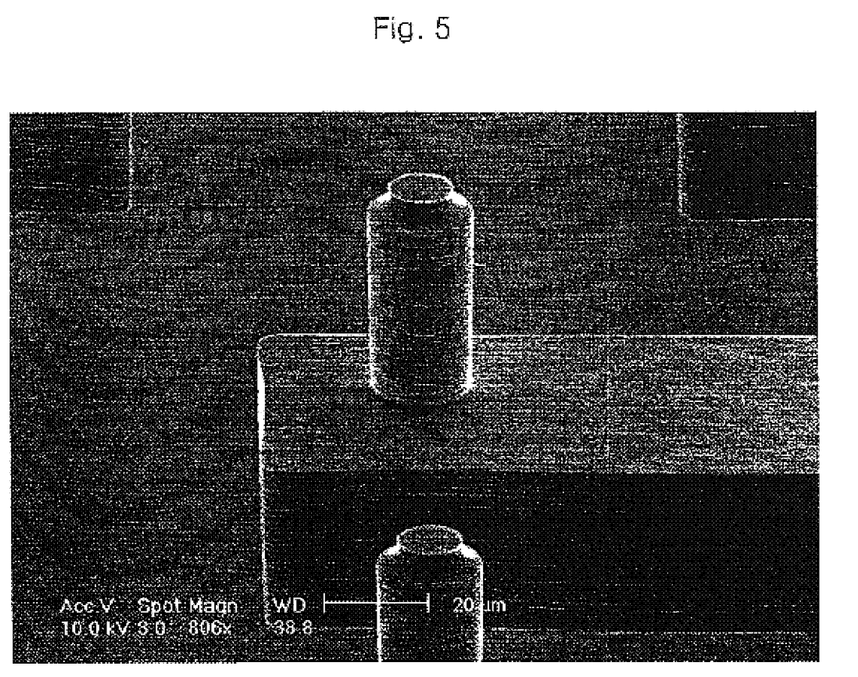

As shown in FIG. 3j, the insulation pattern 22 and the passivation layer 23 are fully removed. Then, the fabrication of the probe structure of the present invention is completed. The completed probe structure is shown in FIGS. 4 and 5.

As apparent from the above description, the present invention provides a probe structure, which is manufactured via the semiconductor fabrication process that can be finely controlled. The fabricated probe structure of the present invention satisfies the high density, the uniformity of size, height and spacing, and the integration of elements.

Therefore, the probe structure of the present invention solves the conventional problems such as long fabrication time of the probe structure, difficulty in finely controlling the structure of the probe structure, complexity of the whole process, mechanical instability of the products, and difficulty in uniformly assembling a plurality of the probe structures. Additionally, the probe structure of the present invention solves several problems caused in an actual testing step of the semiconductor devices, for instance, small-scale of testing process for semiconductor device, long testing time of the semiconductor device, difficulty in performing the contact between the probe structure and the semiconductor device, and having to specially design the test pads of the semiconductor device.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A probe structure for testing semiconductor devices, said probe structure comprising:

a base substrate;

a protrusion formed integrally with the base substrate, protruded from the upper surface of the base substrate at a designated angle, and extending along the upper surface of the base substrate;

probe beams branching off from the protrusion, positioned above the upper surface of the base substrate, and extending along the upper surface of the base substrate in a different direction from the direction of the extension of the protrusion; and probe tips rested on the ends of the probe beams and protruded from the probe beam in a direction perpendicular to the upper surface of the base substrate, and wherein the base substrate, the protrusion, the probe beams, and the probe tips are integrally made of the same material.

2. The probe structure for testing semiconductor devices according to claim 1, wherein the base substrate, the protrusion, the probe beams, and the probe tips are integrally made of one selected from the group consisting of a single crystalline bulk substrate, a SOI (Silicon On Insulator) bulk substrate, and a SOG (Silicon On Glass) bulk substrate.

3. The probe structure for testing semiconductor devices according to claim 2, wherein the single crystalline bulk substrate, the SOI bulk substrate, and the SOG bulk substrate are oriented in the direction of the (111) plane.

4. A method for fabricating a probe structure for testing semiconductor devices, said method comprising the steps of:

forming a plurality of probe tips in the shape of pillar with narrow tip by patterning one surface of a bulk substrate at a designated depth; and then integrally forming a base substrate, a plurality of probe beams positioned above the base substrate, and a protrusion formed integrally with the probe beams by patterning both sides of the surface of the bulk substrate including probe tips.

5. The method for fabricating a probe structure for testing semiconductor devices according to claim 4, wherein the step of forming a plurality of the probe tips in the shape of pillar with narrow tip comprises the sub-steps of:

depositing an insulation layer on the surface of the bulk substrate and patterning said insulation layer so that the insulation layer is left on a predetermined area of the surface of the bulk substrate;

isotropically etching the bulk substrate to a designated depth using the patterned insulation layer as a mask; and anisotropically etching the bulk substrate to a designated depth using the patterned insulation layer as a mask.

6. The method for fabricating a probe structure for testing semiconductor devices according to claim 4, wherein the step of integrally forming the base substrate, a plurality of the probe beams positioned above the base substrate, and the protrusion formed integrally with the probe beams comprises the sub-steps of:

depositing an insulation layer on the surface of the bulk substrate so that the probe tips are covered, and patterning the insulator layer so that the parts of both sides of the surface of the bulk substrate are exposed;

anisotropically etching both sides of the surface of the bulk substrate to a designated depth using the patterned insulation layer as a mask;

depositing a passivation layer on the surface of the bulk substrate so that the patterned insulation layer and the sidewalls of the etched bulk substrate are covered;

patterning the passivation layer so that both sides of the surface of the bulk substrate except for the sidewalls are exposed;

anisotropically etching the exposed both sides of the bulk substrate to a designated depth; and patterning the bulk substrate with the probe tips using a wet etching solution, thereby forming a trench dug into the bulk substrate below the probe tips.

7. The method for fabricating a probe structure for testing semiconductor devices according to claim 6, wherein said wet etching solution is an alkaline solution with a selective etch rate according to the crystalline direction of the bulk substrate.

* * * * *